(12) United States Patent
Daubenspeck et al.

(10) Patent No.: US 8,237,279 B2
(45) Date of Patent: Aug. 7, 2012

(54) COLLAR STRUCTURE AROUND SOLDER BALLS THAT CONNECT SEMICONDUCTOR DIE TO SEMICONDUCTOR CHIP PACKAGE SUBSTRATE

(75) Inventors: Timothy H. Daubenspeck, Colchester, VT (US); Jeffrey P. Gambino, Westford, VT (US); Christopher D. Muzzy, Burlington, VT (US); Wolfgang Sauter, Charlotte, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 12/879,602

(22) Filed: Sep. 10, 2010

(65) Prior Publication Data
US 2012/0061832 A1    Mar. 15, 2012

(51) Int. Cl.
*H01L 23/48* (2006.01)
(52) U.S. Cl. ............. 257/738; 257/737; 257/E23.021; 257/E23.069
(58) Field of Classification Search .......... 257/737, 257/738
See application file for complete search history.

(56) References Cited

U.S. PATENT DOCUMENTS

| 5,208,066 A | 5/1993 | Fujisaki et al. |
|---|---|---|
| 5,962,918 A | 10/1999 | Kimura |
| 6,521,996 B1 * | 2/2003 | Seshan .................. 257/737 |
| 6,995,037 B2 | 2/2006 | Lamson et al. |
| 2008/0054461 A1 | 3/2008 | Lang et al. |
| 2009/0256257 A1 | 10/2009 | Daubenspeck et al. |

FOREIGN PATENT DOCUMENTS

| EP | 191434 B1 | 1/1991 |
|---|---|---|
| JP | 2009110991 A | 5/2009 |

OTHER PUBLICATIONS

Numakura et al., "Micro BGA on Flex Circuits", Sep. 1995, pp. 608-619, Proceedings of the 1995 International Electronics Packaging Conference, Inspect # 06237133, Abstract Only.
Schueller, "Reliability Results for a Wire Bondable Tape Ball Grid Array Package", Sep. 1996, pp. 12-16, vol. 1, Proceedings of Surface Mount International. Advanced Electronic Manufacturing Technologies, Inspect # 06490050, Abstract Only.

* cited by examiner

*Primary Examiner* — Jasmine Clark
(74) *Attorney, Agent, or Firm* — Hoffman Warnick LLC; David A. Cain

(57) ABSTRACT

In one embodiment, a collar structure includes a non-conductive layer that relieves stress around the perimeter of each of the solder balls that connect the semiconductor die to the semiconductor chip package substrate, and another non-conductive layer placed underneath to passivate the entire surface of the die.

20 Claims, 7 Drawing Sheets

FIG. 10

COLLAR STRUCTURE AROUND SOLDER BALLS THAT CONNECT SEMICONDUCTOR DIE TO SEMICONDUCTOR CHIP PACKAGE SUBSTRATE

BACKGROUND

Embodiments of the present invention relate generally to semiconductor chip packaging, and more specifically to a collar structure placed around solder balls used to connect a semiconductor die to a semiconductor chip package substrate.

In a typical assembly of a semiconductor die or integrated circuit to a semiconductor chip package substrate, solder balls are attached to respective bond pads on the die. The semiconductor die is then placed onto the semiconductor chip package substrate. An anneal is performed to join the solder balls on the semiconductor die to respective bond pads on the semiconductor chip package substrate. Typically, there is a high degree of mismatch between the coefficients of thermal expansion (CTE) between the solder balls, the semiconductor die and the semiconductor chip package substrate. The mismatch of CTE results in the formation of large strains that cause thermal stresses to develop about the solder balls and the semiconductor die during thermal cycling. Thermal stresses become more prevalent with the use of low-k dielectrics in the semiconductor dies and lead-free solder balls. In particular, low-k dielectrics tend to be more porous, making them mechanically weak and more susceptible to the formation of thermal stresses resulting from CTE mismatch. Lead-free solder balls generally have a higher melting point than lead solder balls, which further exacerbates the CTE mismatch, and results in more thermal stress formations during thermal cycling.

SUMMARY

In one embodiment, a structure is provided. In this embodiment, the structure comprises at least one solder ball and a semiconductor die. The semiconductor die has at least one conductive bond pad formed upon a surface of the semiconductor die to receive the at least one solder ball. A first non-conductive layer is disposed over the semiconductor die and the at least one conductive bond pad. The first non-conductive layer is disposed over the entire surface of the semiconductor die and underneath the at least one solder ball. A second non-conductive layer is disposed over a portion of the first non-conductive layer and underneath the at least one solder ball. The second non-conductive layer extends underneath the at least one solder ball to slightly beyond a perimeter thereof.

In a second embodiment, a packaged semiconductor device is provided. In this embodiment, the packaged semiconductor device comprises a semiconductor chip package substrate, a plurality of solder balls and a semiconductor die having a plurality of conductive bond pads formed upon a top surface of the semiconductor die that respectively receive the plurality of solder balls to connect the semiconductor die to the semiconductor chip package substrate. The packaged semiconductor device further comprises a first non-conductive layer disposed over the semiconductor die and the plurality of conductive bond pads. The first non-conductive layer is disposed over the entire surface of the semiconductor die and underneath the plurality of solder balls. The packaged semiconductor device further comprises a second non-conductive layer disposed over a portion of the first non-conductive layer and underneath each of the plurality of solder balls, wherein the second non-conductive layer extends underneath each of the plurality of solder balls. The second non-conductive layer extends beyond the perimeter of each of the plurality of solder balls to form a collar therearound.

DETAILED DESCRIPTION

Figure 1:
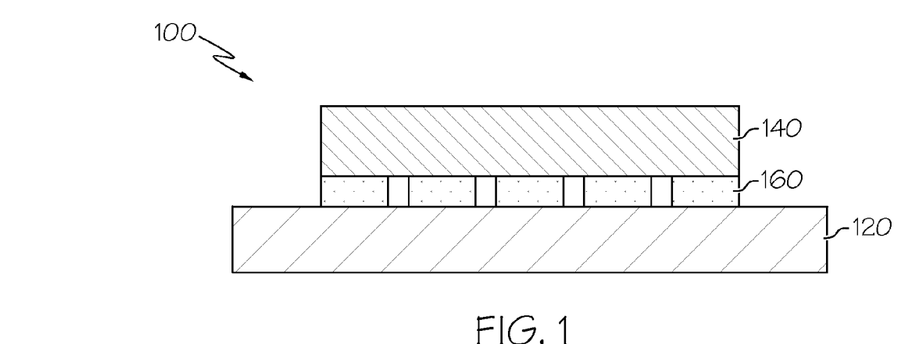
FIG. 1 shows a cross-sectional view of a packaged semiconductor device in which embodiments of the present invention may be utilized.

FIG. 1 shows a cross-sectional view of a packaged semiconductor device 100 in which embodiments of the present invention may be utilized. Packaged semiconductor device 100 includes a semiconductor chip package substrate 120 and a semiconductor die 140 having plurality of solder balls (e.g., controlled collapse chip connection (C4) contacts) 160 attached to a surface of the die that connect to respective bond pads (not shown) disposed on a surface of semiconductor chip package substrate 120 to form a metallurgical joint. Plurality of solder balls 160 may be any solderable material that can include, but is not limited to, material having tin and lead, tin without lead, tin with a residual of copper or silver, tin bismuth, tin indium, etc.

Typically, there is a high degree of mismatch between the coefficients of thermal expansion (CTE) between solder balls 160, semiconductor die 140 and semiconductor chip package substrate 120. The mismatch of CTE results in the formation of large strains that cause thermal stresses to develop about solder balls 160 and semiconductor die 140 during thermal cycling. One approach that has been used to reduce the formation of thermal stresses during thermal cycling is to place a passivation layer (e.g., a compliant material with a relatively low modulus), such as polyimide or benzocyclobutene (BCB), between solder balls 160 and the bond pads used to couple the balls to semiconductor die 140. Despite the use of the passivation layer, thermal stresses still occur in the semiconductor die during thermal cycling. It is believed that the perimeter of solder balls 160 is primarily responsible for the thermal stresses. One approach to dealing with the stresses around the perimeter of solder balls 160 is to make the passivation layer thicker across semiconductor die 140 so that these stresses are reduced. However, if the thickness of the passivation layer is made too thick, the semiconductor wafer from which semiconductor die 140 is processed may become stressed and subsequently warped due to the increased thickness. If the semiconductor wafer becomes warped, then it cannot be processed by semiconductor handler tools, and thus the semiconductor dies on the wafer cannot be processed. Therefore, there is a limit as to how thick the passivation layer can be made.

Embodiments of the present invention as illustrated in FIGS. 2-14 have solved the concern associated with thermal stresses occurring at the perimeter of the solder balls, and the dilemma associated with using a passivation layer (e.g., polyimide or BCB) to absorb stresses that is not too thick to cause warping of the semiconductor wafers. In particular, embodiments of the present invention place a collar around the solder balls to provide a fixed stress cushioning layer underneath the perimeter of the balls that reduces stress therearound. At the same time, another stress cushioning layer is disposed underneath the collars to passivate the entire surface of the semiconductor die. The collars and stress cushioning layer disposed underneath the collars relieve stress at the perimeters of the solder balls without increasing global stress (e.g., warping) on the semiconductor wafer from which the semiconductor die is processed.

Figure 2:
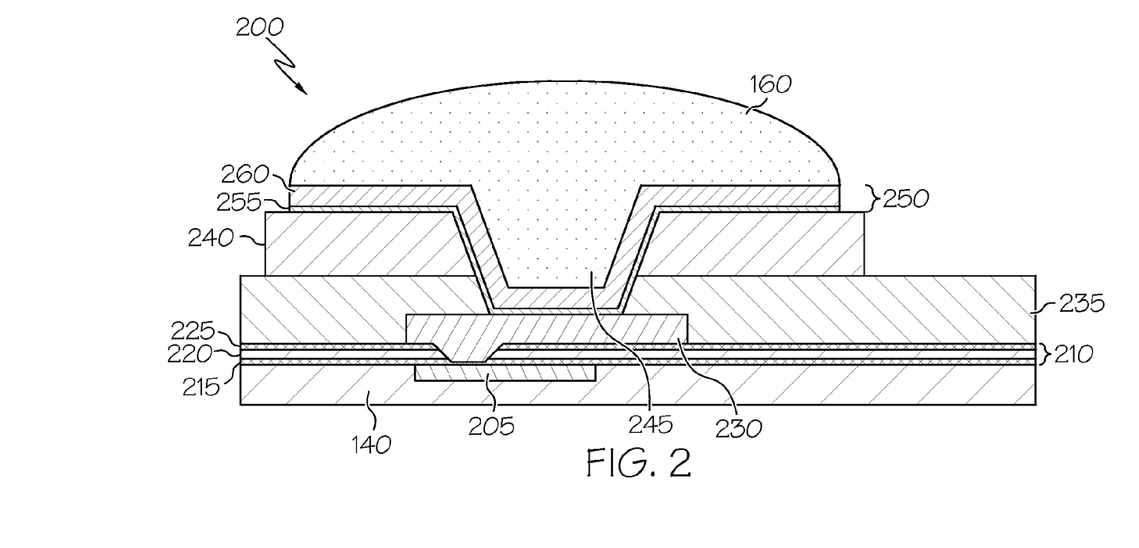
FIG. 2 shows a cross-sectional view of a semiconductor structure according to one embodiment of the present invention.

FIG. 2 shows a cross-sectional view of a semiconductor structure 200 according to one embodiment of the present invention that can be used as part of packaged semiconductor device 100 depicted in FIG. 1. Note that solder ball 160 and semiconductor die 140 are flipped from their position depicted in FIG. 1. For ease of illustration, FIG. 2 only shows a specific portion of semiconductor structure 200. Those skilled in the art will recognize that semiconductor structure 200 extends to the left and to the right of the portion shown in FIG. 2. As a result, there will be additional solder balls 160, and likewise underfill materials, which are described below, that are positioned between the solder balls 160 and semiconductor die 140.

As shown in FIG. 2, semiconductor structure 200 comprises a semiconductor die 140 that may have various circuit components (not shown) integrated therein that are connected through internal signal lines (not shown). Metal line 205 represents the last metal line in semiconductor die 140 that provides electrical connection to the other circuit components (e.g., transistors, capacitors, resistors, etc.) in the die. A passivation layer 210 is formed on a surface of semiconductor die 140. Passivation layer 210 comprises dielectric layers 215, 220, and 225. In one embodiment, dielectric layers 215 and 225 can comprise silicon nitride, while dielectric layer 220 can comprise silicon dioxide. A conductive bond pad 230 is formed upon passivation layer 210 to attach to solder ball 160. In one embodiment, conductive bond pad 230 may be an electrically conductive material such as aluminum.

Another passivation layer referred to herein as a first non-conductive layer 235 is disposed over passivation layer 210 and conductive bond pad 230. As shown in FIG. 2, first non-conductive layer 235 is disposed over the entire surface of passivation layer 210 and conductive bond pad 230 and underneath solder ball 160. In one embodiment, first non-conductive layer 235 comprises a polymer. In particular, the polymer may be selected from the group consisting of polyimide or BCB. Polyimide can be photosensitive polyimide (PSPI) or non-photosensitive polyimide. Similarly, BCB can be photosensitive BCB or non-photosensitive BCB. Those skilled in the art will recognize that other polymers can be used, especially those that are insulators, have a low dielectric constant (e.g., less than about 4) and are thermally stable up to 300 degrees Celsius. In one embodiment, first non-conductive layer 235 may have a thickness that ranges from about 1 micron to about 50 microns. In another embodiment, first non-conductive layer 235 may have a thickness that ranges from about 5 microns to about 15 microns.

Semiconductor structure 200 further includes another passivation layer referred to herein as a second non-conductive layer 240 disposed over a portion of first non-conductive layer 235 and underneath solder ball 160. As shown in FIG. 2, second non-conductive layer 240 extends underneath solder ball 160 to slightly beyond a perimeter thereof. In one embodiment, second non-conductive layer 240 comprises a polymer. In particular, the polymer may be selected from the group consisting of polyimide or BCB. Polyimide can be photosensitive polyimide (PSPI) or non-photosensitive polyimide. Similarly, BCB can be photosensitive BCB or non-photosensitive BCB. Those skilled in the art will recognize that other polymers can be used, especially those that are insulators, have a low dielectric constant (e.g., less than about 4) and are thermally stable up to 300 degrees Celsius. In one embodiment, second non-conductive layer 240 may have a thickness that ranges from about 1 micron to about 50 microns. In another embodiment, second non-conductive layer 240 may have a thickness that ranges from about 5 microns to about 15 microns. Those skilled in the art will recognize that additional layers of a non-conductive layer can be used in addition to second non-conductive layer 240 to form the collar around solder ball 160.

Referring back to FIG. 2, a via 245 extends upwardly from conductive bond pad 230 through first non-conductive layer 235 and second non-conductive layer 240. In one embodiment, via 245 may comprise a hole or trench formed by a conventional lithographic process. As shown in FIG. 2, a ball limiting metallurgy layer (BLM) 250 is disposed in via 245 and extends upwardly therefrom along a top surface of second non-conductive layer 240 underneath solder ball 160 to a location that is approximately coincident with perimeter of the ball. The top surface of second non-conductive layer 240 extends slightly beyond the perimeter of the solder ball 160 and BLM layer 250. In one embodiment, the amount that second non-conductive layer 240 extends slightly beyond the perimeter of the solder ball 160 can range from about 0.1 um to about 50 um. Preferably, the amount can range from about 1 um to about 10 um. Furthermore, as shown in FIG. 2, BLM layer 250 is provided against an internal wall surface of first non-conductive layer 235 and an internal wall surface of second non-conductive layer 240. In one embodiment, BLM layer 250 comprises barrier layers 255 and 260. In one embodiment, barrier layer 255 may comprise a titanium-tungsten (TiW) alloy diffusion barrier layer, while barrier layer 260 may comprise a copper-chrome copper (Cu/CrCu) layer. Those skilled in the art will recognize that barrier layers 255 and 260 may be made from other materials. Furthermore, those skilled in the art will recognize that BLM layer 250 may have additional layers besides barrier layers 255 and 260. For example, a nickel (Ni) layer may be placed on top of the Cu/CrCu layer (i.e., barrier layer 260).

In this structure, first non-conductive layer 235 acts globally to passivate the entire surface of semiconductor die 140, while second non-conductive layer 240 in conjunction with BLM 250 act to form a collar around solder ball 160 which reduce stress around the perimeter of ball. Because second non-conductive layer 240 and BLM 250 form a collar around solder ball 160, the total thickness of stress absorbing materials is kept to an amount that will not cause warping of the semiconductor wafers in which semiconductor die 140 is processed.

Figure 3:
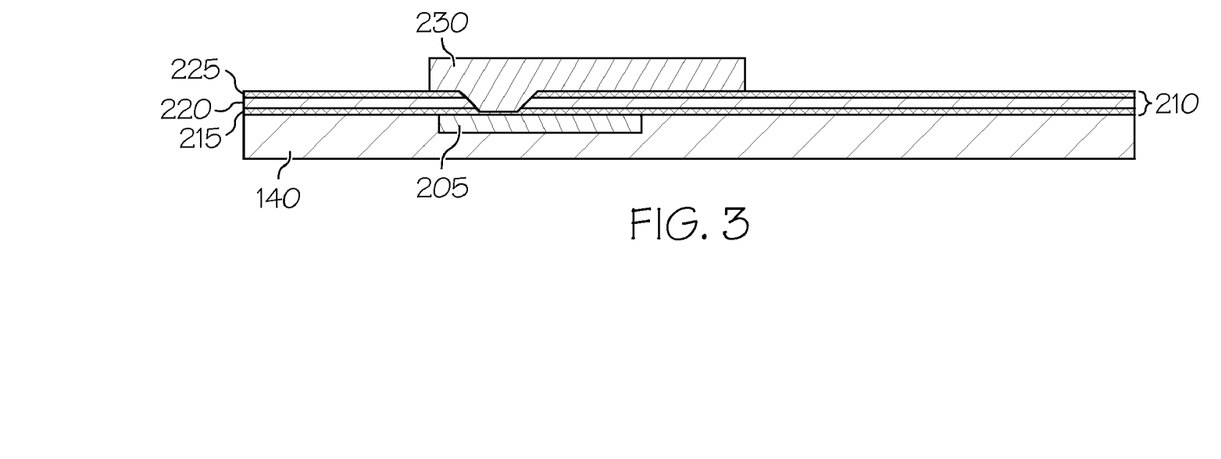
FIGS. 3-8 show the general process flow of forming the semiconductor structure depicted in FIG. 2 according to one embodiment of the present invention.

FIG. 3-8 show the general process flow of forming semiconductor structure 200 depicted in FIG. 2 according to one embodiment of the present invention. In this process, first non-conductive layer 235 and second non-conductive layer 240 are formed from a photosensitive polymer (e.g., PSPI, and photosensitive BCB). The process starts at FIG. 3 with semiconductor die 140 and its various circuit components (not shown) integrated therein. As shown in FIG. 3, semiconductor 140 is shown with last metal line 205 that provides electrical connection to the circuit components in the die. Metal line 205 can comprise an electrically conductive material such as copper. In one embodiment, metal line 205 can be formed by a conventional dual damascene process. Passivation layer 210, which comprises dielectric layers 215, 220, and 225, is formed on top of semiconductor die 140. In one embodiment, dielectric layers 215 and 225 can comprise silicon nitride, while dielectric layer 220 can comprise silicon dioxide. Dielectric layers 215, 220, and 225 can be formed by conventional chemical vapor deposition (CVD) processes.

Conductive bond pad 230 is formed upon passivation layer 210 as shown in FIG. 3. In one embodiment, conductive bond pad 230 is formed by forming a terminal via hole in passivation layers 215, 220, and 225 such that the top surface of metal line 205 is exposed to the surrounding ambient through the terminal via hole. In one embodiment, the terminal via hole can be formed by lithographic and etching processes. Next, an electrically conductive layer is formed on top of the structure of FIG. 3 such that the terminal via hole is filled with the electrically conductive layer. In one embodiment, the electrically conductive layer can comprise an electrically conductive material such as aluminum. In one embodiment, the electrically conductive layer can be formed by a physical vapor deposition (PVD). Next, in one embodiment, the electrically conductive layer is patterned to form conductive bond pad 230 upon passivation layer 210 as shown in FIG. 3. In one embodiment, the electrically conductive layer can be patterned to form conductive bond pad 230 by using lithographic and etching processes.

Figure 4:
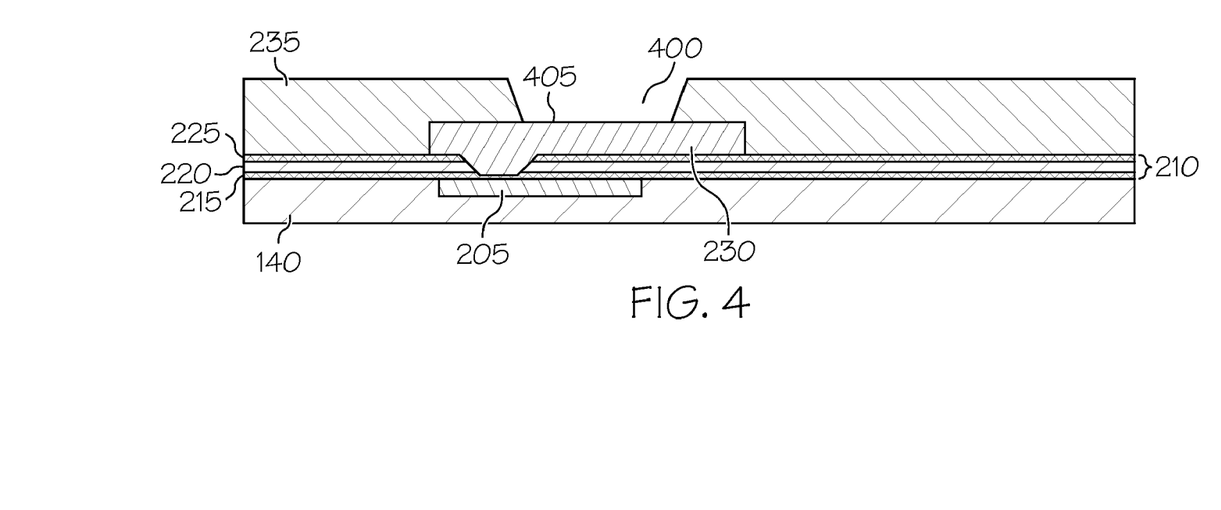

Next, as shown in FIG. 4, first non-conductive layer 235 is formed over conductive bond pad 230 and the remaining surface of passivation layer 210. In one embodiment, first non-conductive layer 235 comprises a photosensitive polymer. In particular, the photosensitive polymer may be PSPI or photosensitive BCB. In one embodiment, first non-conductive layer 235 can be formed by a conventional spin-on process. In one embodiment, first non-conductive layer 235 may have a thickness that ranges from about 1 micron to about 50 microns. In another embodiment, first non-conductive layer 235 may have a thickness that ranges from about 5 microns to about 15 microns.

As shown in FIG. 4, a via opening 400 is formed in first non-conductive layer 235 such that a top surface 405 of the bond pad 230 is exposed to the surrounding ambient through the via opening. In one embodiment, via opening 400 can be holes or trenches. In one embodiment, via opening 400 can be formed by a conventional lithographic process. The structure that remains after forming via opening 400 is cured using a conventional curing technique.

Figure 5:
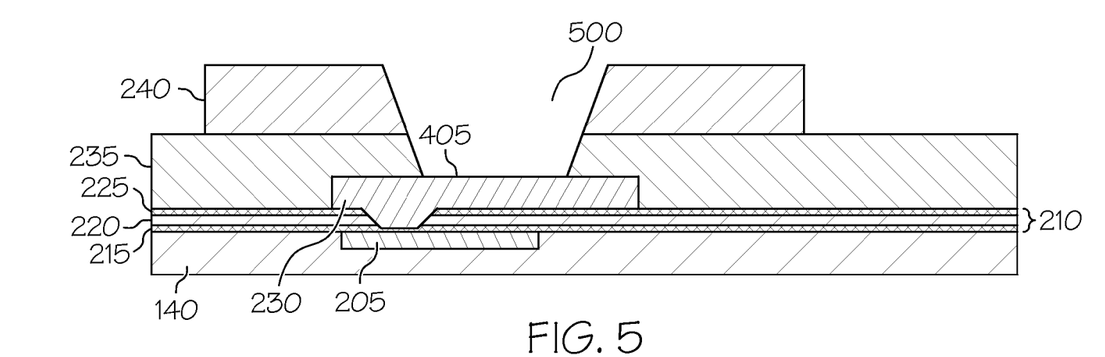

Next, as shown in FIG. 5, second non-conductive layer 240 is formed over first non-conductive layer 235. In one embodiment, second non-conductive layer 240 comprises a photosensitive polymer. In particular, the photosensitive polymer may PSPI or photosensitive BCB. In one embodiment, second non-conductive layer 240 can be formed by a conventional spin-on process. In one embodiment, second non-conductive layer 240 may have a thickness that ranges from about 1 micron to about 50 microns. In another embodiment, second non-conductive layer 240 may have a thickness that ranges from about 5 microns to about 15 microns.

As shown in FIG. 5, a via opening 500 is formed in first non-conductive layer 235 and second non-conductive layer 240 such that a top surface 405 of the bond pad 230 is exposed to the surrounding ambient through the via opening. In one embodiment, via opening 500 can be holes or trenches. In one embodiment, via opening 500 can be formed by a conventional lithographic process. The structure that remains after forming via opening 500 is cured using a conventional curing technique.

Figure 6:
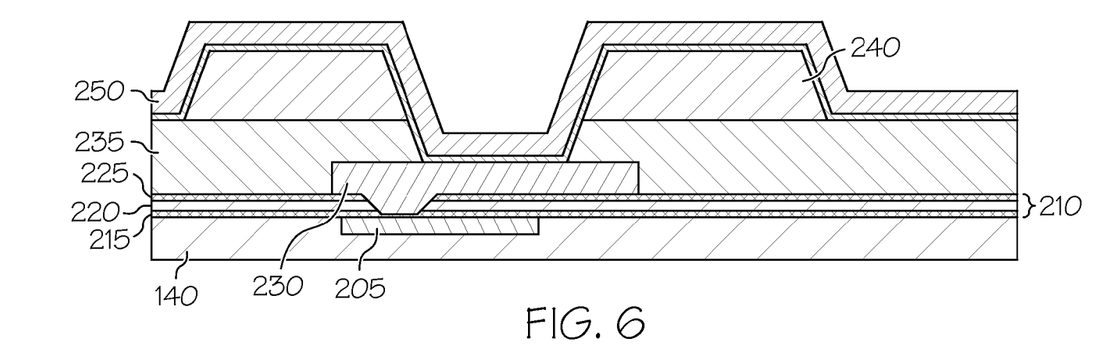

In FIG. 6, the structure of FIG. 5 is deposited with BLM 250. As shown in FIG. 6, BLM 250 is deposited over second non-conductive layer 240 and in via 500 (FIG. 5), such that BLM 250 is deposited against internal sidewalls of first non-conductive layer 235 and second non-conductive layer 240, and deposited on top surface 405 (FIG. 4) of the bond pad 230. In one embodiment, BLM 250 may comprise a barrier layer such as a TiW alloy layer deposited on a Cu/CrCu layer. In one embodiment, BLM 250 can be formed by a conventional PVD process.

Figure 7:
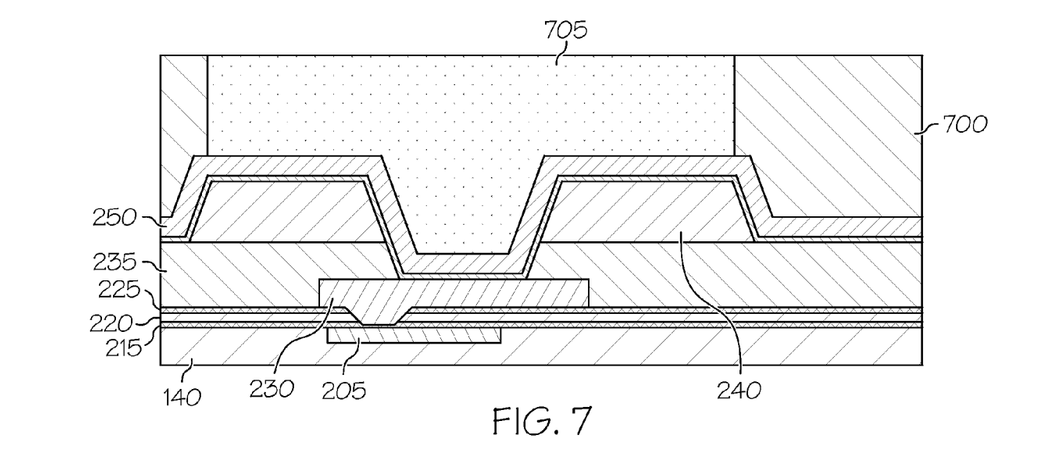

Next, FIG. 7 shows the formation of solder ball 160 on the structure of FIG. 6. In particular, a photoresist layer 700 is deposited over BLM 250. In one embodiment, photoresist layer 700 can be made of a photosensitive polymer. In one embodiment, the photoresist material can be deposited over BLM 250 using conventional spin-on processing.

Although not shown in FIG. 7, in one embodiment, photoresist layer 700 is patterned to form a hole therein. The patterning results in a final via opening (not shown FIG. 7) that is in alignment with the formed hole. In one embodiment, the photoresist layer 700 is patterned by a conventional lithographic process.

As shown in FIG. 7, the hole and final via opening are filled with an electrically conductive material resulting in an electrically conductive region 705. In one embodiment, the electrically conductive material used to form electrically conductive region 705 may comprise a mixture of tin and lead or a lead-free mixture of different metals. In one embodiment, the hole and final via opening can be filled with the electrically conductive material by an electroplating technique.

Figure 8:
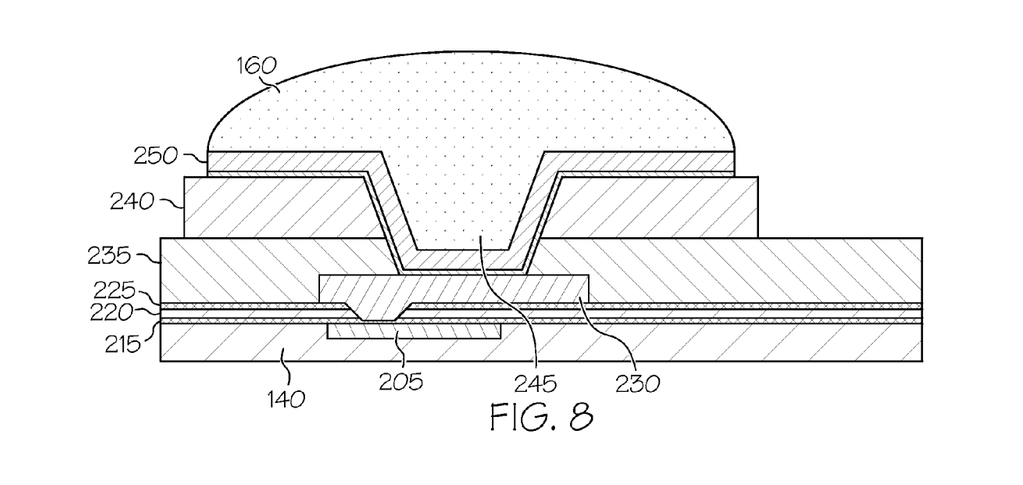

As shown in FIG. 8, the remaining photoresist layer 700 is then removed from the structure shown in FIG. 7. In one embodiment, the remaining photoresist layer 700 can be removed by a wet etching process. In addition BLM layer 250 is patterned so that it extends along the surface of second non-conductive layer 240 to a point that is slightly before an edge of second non-conductive layer. In one embodiment, BLM layer 250 is patterned by a $H_2O_2$-based wet etch or dry etch process followed by electroetching using electrically conductive region 705 (FIG. 7) as a blocking mask.

Next, electrically conductive region 705 (FIG. 7) is heated and reshaped by a reflow process resulting in solder ball 160 on BLM region 250. Solder ball 160 is electrically connected to metal line 205 through the final via 245, BLM region 250, and conductive bond pad 230. As shown in FIG. 8, a ball limiting metallurgy layer (BLM) 250 is disposed in via 245 and extends upwardly therefrom along a top surface of second non-conductive layer 240 underneath solder ball 160 to a location that is approximately coincident with perimeter of the ball. The top surface of second non-conductive layer 240 extends slightly beyond the perimeter of the solder ball 160 and BLM layer 250. In one embodiment, the amount that second non-conductive layer 240 extends slightly beyond the perimeter of the solder ball 160 can range from about 0.1 um to about 50 um. Preferably, the amount can range from about 1 um to about 10 um.

As mentioned above, first non-conductive layer 235 acts globally to passivate the entire surface of semiconductor die 140, while second non-conductive layer 240 in conjunction with BLM 250 act to form a collar around solder ball 160 which reduce stress around the perimeter of each ball. Because second non-conductive layer 240 and BLM 250 form a collar around each solder ball 160, the total thickness of stress absorbing materials is kept to an amount that will not cause warping of the semiconductor wafers in which semiconductor die 140 is processed.

FIG. 9-14 show the general process flow of forming the semiconductor structure depicted in FIG. 2 according to another embodiment of the present invention. In this embodiment, semiconductor structure 200 of FIG. 2 has a first non-conductive layer 235 and a second non-conductive layer 240 formed from a polymer passivation material that is not photosensitive (e.g., non-photosensitive polyimide or non-photosensitive BCB).

Figure 9:
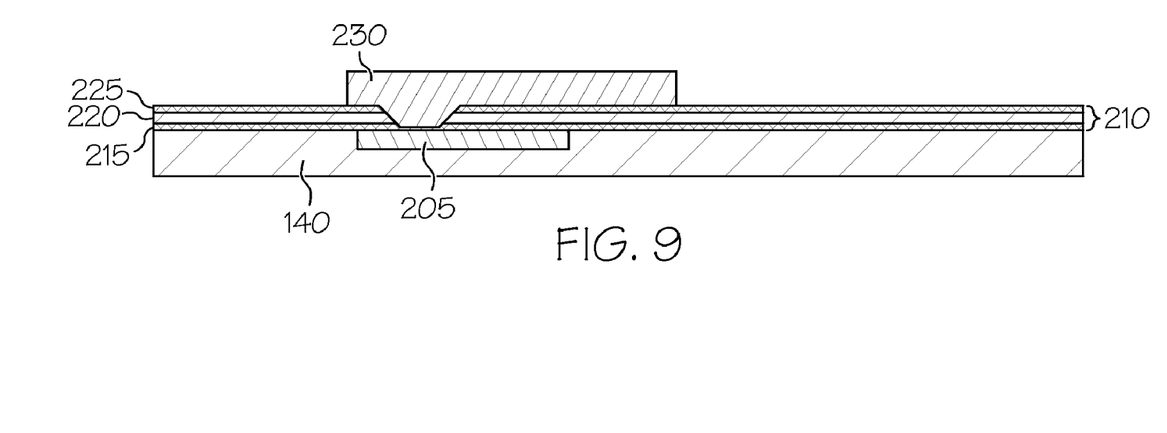
FIGS. 9-14 show the general process flow of forming the semiconductor structure depicted in FIG. 2 according to another embodiment of the present invention.

The process of this embodiment starts at FIG. 9, and like FIG. 3, there is semiconductor die 140 and its various circuit components (not shown) integrated therein. Metal line 205 provides electrical connection to the circuit components in the die. Passivation layer 210, which comprises dielectric layers 215, 220, and 225, is formed on top of semiconductor die 140. Conductive bond pad 230 is formed upon passivation layer 210.

Figure 10:
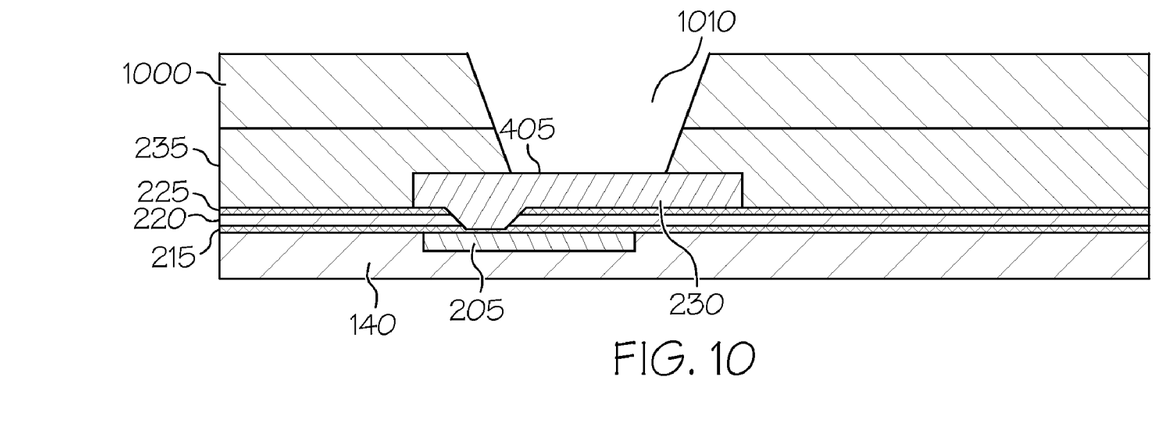

Next, as shown in FIG. 10, first non-conductive layer 235 is formed over conductive bond pad 230 and the remaining surface of passivation layer 210. In one embodiment, first non-conductive layer 235 comprises a polymer. In particular, the polymer may be a non-photosensitive polymer (e.g., non-photosensitive polyimide or non-photosensitive BCB). After first non-conductive layer 235 has been deposited and cured, a resist material 1000 is deposited on first non-conductive layer 235. A resist pattern is then applied to resist material 1000, so that via opening 1010 can be formed in first non-conductive layer 235, such that top surface 405 of the bond pad 230 is exposed to the surrounding ambient through the via opening. In one embodiment, via opening 1010 is formed by a conventional etching technique. The structure that remains after forming via opening 1010 then undergoes a conventional strip resist (not shown).

Figure 11:
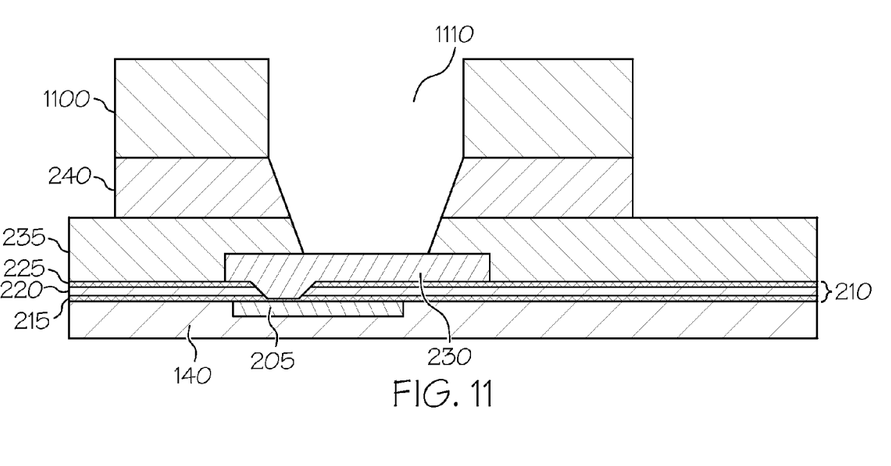

Next, as shown in FIG. 11, second non-conductive layer 240 is formed over first non-conductive layer 235. In one embodiment, second non-conductive layer 240 comprises a polymer. In particular, the polymer may be a non-photosensitive polymer (e.g., non-photosensitive polyimide or non-photosensitive BCB). After second non-conductive layer 240 has been deposited and cured, a resist material 1100 is deposited on second non-conductive layer 240. A resist pattern is then applied to resist material 1100, so that via opening 1110 can be formed in first non-conductive layer 235 and second non-conductive layer 240, such that top surface 405 of the bond pad 230 is exposed to the surrounding ambient through the via opening. In one embodiment, via opening 1110 is formed by a conventional etching technique. The structure that remains after forming via opening 1110 then undergoes a conventional strip resist (not shown).

Figure 12:
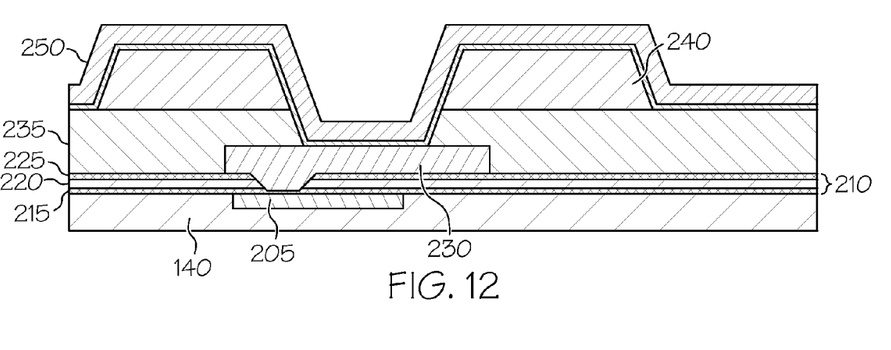

In FIG. 12, the structure of FIG. 11 is deposited with BLM 250. As shown in FIG. 12, BLM 250 is deposited over second non-conductive layer 240 and in via 1110 (FIG. 11), such that BLM 250 is deposited against internal sidewalls of first non-conductive layer 235 and second non-conductive layer 240, and deposited on surface 405 (FIG. 10) of the bond pad 230. In one embodiment, BLM 250 may comprise a barrier layer such as a TiW alloy layer deposited on a Cu/CrCu layer. In one embodiment, BLM 250 can be formed by a conventional PVD process.

Figure 13:
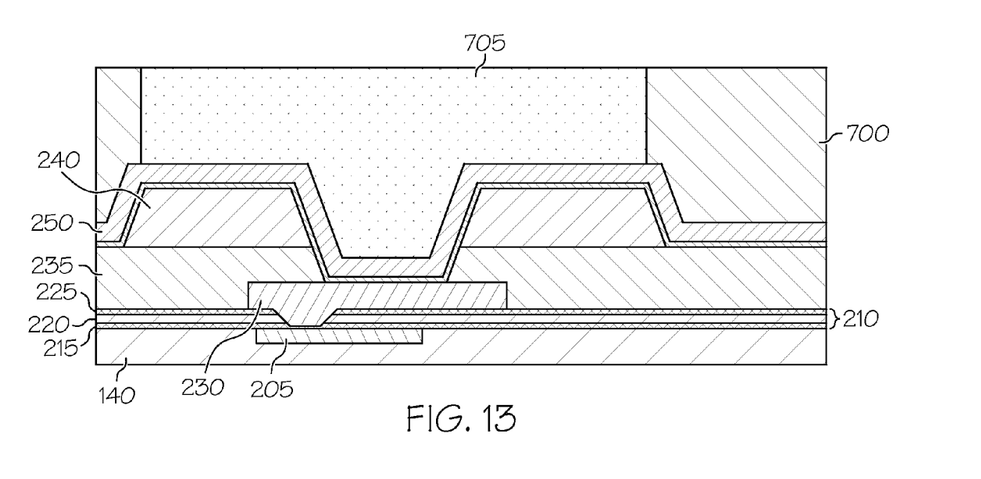

Next, FIG. 13 shows the formation of solder ball 160 on the structure of FIG. 12. In particular, a photoresist layer 700 is deposited over BLM 250. In one embodiment, photoresist layer 700 can be made of a photosensitive polymer. In one embodiment, the photoresist material can be deposited over BLM 250 using conventional spin-on processing.

Although not shown in FIG. 13, in one embodiment, photoresist layer 700 is patterned to form a hole therein. The patterning results in a final via opening (not shown FIG. 13) that is in alignment with the formed hole. In one embodiment, the photoresist layer 700 is patterned by a conventional lithographic process.

As shown in FIG. 13, the hole and final via opening are filled with an electrically conductive material resulting in an electrically conductive region 705. In one embodiment, the electrically conductive material used to form electrically conductive region 705 may comprise a mixture of tin and lead or a lead-free mixture of different metals. In one embodiment, the hole and final via opening can be filled with the electrically conductive material by an electroplating technique.

Figure 14:
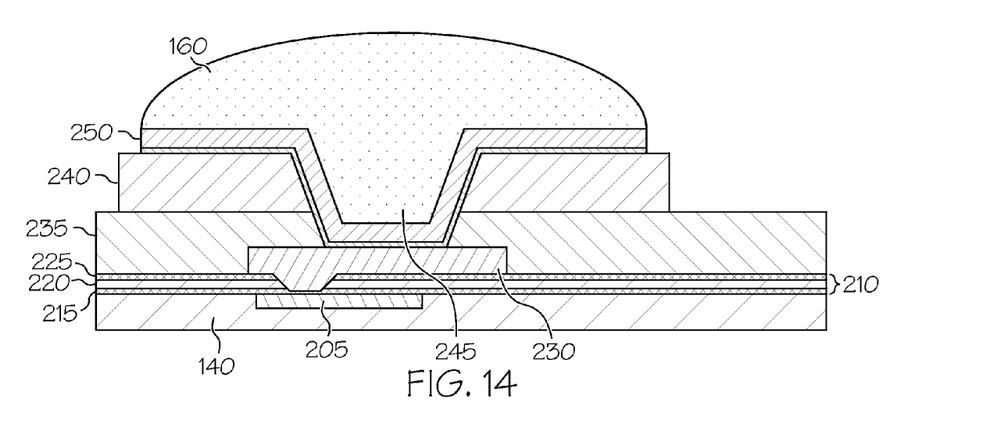

As shown in FIG. 14, the remaining photoresist layer 700 is then removed from the structure shown in FIG. 13. In one embodiment, the remaining photoresist layer 700 can be removed by a wet etching process. In addition BLM layer 250 is patterned so that it extends along the top surface of second non-conductive layer 240 to a point that is slightly before an edge of second non-conductive layer. In one embodiment, BLM layer 250 is patterned by a $H_2O_2$-based wet etch or dry etch process followed by electroetching using electrically conductive region 705 (FIG. 13) as a blocking mask.

Next, electrically conductive region 705 (FIG. 13) is heated and reshaped by a reflow process resulting in solder ball 160 on BLM region 250. Solder ball 160 is electrically connected to metal line 205 through the final via 245, BLM region 250, and conductive bond pad 230. As shown in FIG. 14, BLM 250 is disposed in via 245 and extends upwardly therefrom along a top surface of second non-conductive layer 245 underneath each solder ball 160 to a location that is approximately coincident with the perimeter of the solder ball. The top surface of second non-conductive layer 240 extends slightly beyond the perimeter of the solder ball 160 and BLM layer 250. As mentioned above, first non-conductive layer 235 acts globally to passivate the entire surface of semiconductor die 140, while second non-conductive layer 240 in conjunction with BLM 250 act to form a collar around solder ball 160 which reduce stress around the perimeter of each ball. Because second non-conductive layer 240 and BLM 250 form a collar around each solder ball 160, the total thickness of stress absorbing materials is kept to an amount that will not cause warping of the semiconductor wafers in which semiconductor die 140 is processed.

The foregoing processes described in FIGS. 3-14 show some of the processing functions associated with fabricating the semiconductor structure depicted in FIG. 2. In this regard, each figure represents a process act associated with forming the semiconductor structure. It should also be noted that in some alternative implementations, the acts noted in the figures may occur out of the order noted in the figures or, for example, may in fact be executed in different order, depending upon the acts involved. Also, one of ordinary skill in the art will recognize that additional figures that describe the formation of the semiconductor structure may be added.

The semiconductor dies or integrated circuit chips that are integrated with the semiconductor structure described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A structure, comprising:
   at least one solder ball;
   a semiconductor die having at least one conductive bond pad formed upon a surface of the semiconductor die to receive the at least one solder ball;
   a first non-conductive layer disposed over the semiconductor die and the at least one conductive bond pad, wherein the first non-conductive layer is disposed over the entire surface of the semiconductor die and underneath the at least one solder ball; and
   a second non-conductive layer disposed over a portion of the first non-conductive layer and underneath the at least one solder ball, wherein the second non-conductive layer extends underneath the at least one solder ball to slightly beyond a perimeter thereof, wherein the second non-conductive layer extends along only a limited portion of a surface of the first non-conductive layer beyond the perimeter of the at least one solder ball.

2. The structure according to claim 1, wherein each of the first non-conductive layer and the second non-conductive layer comprises a polymer.

3. The structure according to claim 2, wherein the polymer is selected from the group consisting of photosensitive polyimide (PSPI), non-photosensitive polyimide, photosensitive benzocyclobutene (BCB), and non-photosensitive BCB.

4. The structure according to claim 1, wherein each of the first non-conductive layer and the second non-conductive layer has a thickness that ranges from about 1 micron to about 50 microns.

5. The structure according to claim 4, wherein each of the first non-conductive layer and the second non-conductive layer has a thickness that ranges from about 5 microns to about 15 microns.

6. The structure according to claim 1, further comprising at least one via extending upwardly from the at least one conductive bond pad through the first non-conductive layer and the second non-conductive layer.

7. The structure according to claim 6, further comprising a ball limiting metallurgy (BLM) layer disposed in the at least one via, and extending therefrom along a top surface of the second non-conductive layer underneath the at least one solder ball to a location that is approximately coincident with the perimeter of the at least one solder ball.

8. The structure according to claim 7, wherein the second non-conductive layer extends slightly beyond the perimeter of at least one solder ball.

9. The structure according to claim to claim 7, wherein the BLM layer is provided against an internal wall surface of the first non-conductive layer and an internal wall surface of the second non-conductive layer.

10. A packaged semiconductor device, comprising:
    a semiconductor chip package substrate;
    a plurality of solder balls;
    a semiconductor die having a plurality of conductive bond pads formed upon a top surface of the semiconductor die that respectively receive the plurality of solder balls to connect the semiconductor die to the semiconductor chip package substrate;
    a first non-conductive layer disposed over the semiconductor die and the plurality of conductive bond pads, wherein the first non-conductive layer is disposed over the entire surface of the semiconductor die and underneath the plurality of solder balls;
    a second non-conductive layer disposed over a portion of the first non-conductive layer and underneath each of the plurality of solder balls, wherein the second non-conductive layer extends underneath each of the plurality of solder balls, wherein the second non-conductive layer extends beyond the perimeter of each of the plurality of solder balls to form a collar therearound, and wherein the second non-conductive layer extends along only a limited portion of a surface of the first non-conductive layer beyond the perimeter of each of the plurality of solder balls.

11. The packaged semiconductor device according to claim 10, wherein each of the first non-conductive layer and the second non-conductive layer comprises a polymer.

12. The packaged semiconductor device according to claim 11, wherein the polymer is selected from the group consisting of photosensitive polyimide (PSPI), non-photosensitive polyimide, photosensitive benzocyclobutene (BCB), and non-photosensitive BCB.

13. The packaged semiconductor device according to claim 10, wherein each of the first non-conductive layer and the second non-conductive layer has a thickness that ranges from about 1 micron to about 50 microns.

14. The packaged semiconductor device according to claim 13, wherein each of the first non-conductive layer and the second non-conductive layer has a thickness that ranges from about 5 microns to about 15 microns.

15. The packaged semiconductor device according to claim 10, further comprising at least one via extending upwardly from the at least one conductive bond pad through the first non-conductive layer and the second non-conductive layer.

16. The packaged semiconductor device according to claim 15, further comprising a ball limiting metallurgy (BLM) layer disposed in the at least one via and extending therefrom along a top surface of the second non-conductive layer underneath each of the plurality of solder balls to a location that is approximately coincident with the perimeter of each of the plurality of solder balls.

17. The packaged semiconductor device according to claim 16, wherein the second non-conductive layer extends slightly beyond the perimeter of each of the plurality of solder balls.

18. The packaged semiconductor device according to claim 16, wherein the BLM layer is provided against an internal wall surface of the first non-conductive layer and an internal wall surface of the second non-conductive layer.

19. The packaged semiconductor device according to claim 10, wherein the first non-conductive layer passivates all of the top surface of the semiconductor die.

20. The packaged semiconductor device according to claim 10, wherein the second non-conductive layer relieves stress at the perimeter of each of the plurality of solder balls.

* * * * *